SEMICONDUCTOR BODIES FOR SIGNAL TRANSLATING DEVICES

Original Filed July 24, 1950 2 Sheets-Sheet 1

INVENTORS: W. L. BOND
M. SPARKS
G. K. TEAL
BY [signature]
ATTORNEY

INVENTORS: W.L. BOND
M. SPARKS
G.K. TEAL
BY [signature]
ATTORNEY

United States Patent Office 2,694,024

Patented Nov. 9, 1954

2,694,024

SEMICONDUCTOR BODIES FOR SIGNAL TRANSLATING DEVICES

Walter L. Bond, New Providence, Morgan Sparks, Basking Ridge, and Gordon K. Teal, Summit, N. J., assignors to Bell Telephone Laboratories, Incorporated, New York, N. Y., a corporation of New York Original application July 24, 1950, Serial No. 175,584, now Patent No. 2,651,831, dated September 15, 1953. Divided and this application July 26, 1952, Serial No. 301,128

6 Claims. (Cl. 148—33)

This application is a division of the application Serial No. 175,584, filed July 24, 1950, now U. S. Patent 2,651,831.

This invention relates to electrical elements of semiconductor material, for example germanium and silicon, in the form of compound crystals of which the components are of different crystalline orientations.

One general object of the invention is to provide compound crystals of semiconductor material including components of different crystalline orientations physically united at a boundary surface.

It is found that in compound crystals so produced of high purity semiconductor material of N-type conductivity, crystal lattice defects at the boundary surface confer P-type conductivity on the material immediately adjacent the boundary and thereby constitute an NPN junction, coextensive with the boundary.

Thus another object of the invention is to provide an extended NPN junction in semiconductor material.

Semiconductor bodies having therein an NPN junction find application in a variety of signal translating devices, for example in amplifiers one type of which is disclosed in the Patent 2,569,347, granted September 25, 1951, to W. Shockley. Further, as disclosed in the application Serial No. 98,008, filed June 9, 1949, now Patent 2,623,103, of R. J. Kircher, in certain such devices an NPN junction in the semiconductor body leads to advantageous operating characteristics, notably improved stability and low positive feedback impedance. Semiconductor bodies in accordance with this invention, it has been found, are particularly useful in amplifying devices of the type disclosed in the latter application.

Another object of the invention is thus to provide semiconductor bodies particularly useful in transistor units of low base and feedback resistance.

In the method to be described, two seed crystals of semiconductor material, germanium being selected for illustration, are obtained, each of N-type electrical conductivity, and machined to have crystal lattices differing some ten degrees in orientation with respect to one or another of three rectangular axes perpendicular respectively to the crystal planes (111), (211) and (110). The seed crystals are then clamped together over a common surface perpendicular to or including the chosen axis to form a duplex seed. The exact angle of orientation may vary some, the requirement being that enough defects be present to give a P-type layer at the boundary. The number of acceptor centers necessary will depend on the purity of the material used.

A melt of high purity N-type germanium is then prepared and the joined seed crystals used to draw from it a germanium rod of desired length and girth. In this operation, the crystal boundary between the seeds is propagated lengthwise of the rod as it is drawn, producing a rod comprising two adjoined crystals individually of the same crystalline orientation and conductivity type as the seeds and physically continuous across a longitudinal crystal boundary. As already mentioned, it is found that lattice defects at the junction surface between the components of the drawn rod result in a very thin sheet of P-type material in the immediate vicinity of the surface so that the rod constitutes an elongated NPN junction which may be sectioned transversely of its length to furnish a number of discs each containing a P-type sheet, normal to the line of section, between two N-type regions.

Another object of the invention, therefore, is to provide an extended longitudinal NPN unit from which a plurality of elements each including such junction and of convenient shape may be cut.

A method which provides transverse PN or NPN junctions in a single rod crystal of semiconductor material is disclosed in the application of M. Sparks and G. K. Teal, filed June 15, 1952, Serial No. 168,181, now Patent No. 2,631,356.

The present invention makes use in one embodiment of the apparatus and method disclosed and claimed by J. B. Little and G. K. Teal in their application Serial No. 138,354, filed January 13, 1950, for drawing single germanium crystals in rod form from a mass of molten germanium.

That application discloses and claims the production of grain boundaries by the use of joined seeds of different crystalline orientations. However, when seeds are oriented at random with respect to each other, the boundary produced in the composite drawn crystal does not consistently yield a P-type electrical characteristic. By the method disclosed herein, one is able to find an angle of orientation about one or another lattice plane which produces reproducible crystal boundaries with NPN characteristics.

It is thought that atomic lattice defects in the crystal lattice which occur at the boundary act as acceptors and thus tend to produce P-type conductivity. The number of such acceptor centers necessary to overcome the donors present throughout the semiconductor and thus produce the desired thin P-type sheet will thus depend on the donor concentration in the germanium melt. It has been determined that for high back voltage germanium of about 5–10 ohm/cm. resistivity, a mismatch of ten degrees is suitable. A further advantage of using seeds X-ray oriented is that the composite crystal may be grown in approximately the crystal plane which propagates itself most easily. In germanium this is the (111) plane, the plane of greatest atomic density. It is accordingly arranged so to machine the seed crystals that their (111) planes are approximately normal to the direction of drawing.

Another object of the invention is, therefore, to provide a method of drawing composite crystals of germanium in the form of rods including a crystal boundary extending lengthwise of the rod substantially at right angles to the crystalline plane of greatest atomic density.

The invention will be fully understood from the following description, with accompanying drawings in which.

While the following description specifically relates to germanium it will be understood that silicon may be employed in the same way to produce a similar result.

Figures 1, 2, 3, 4:
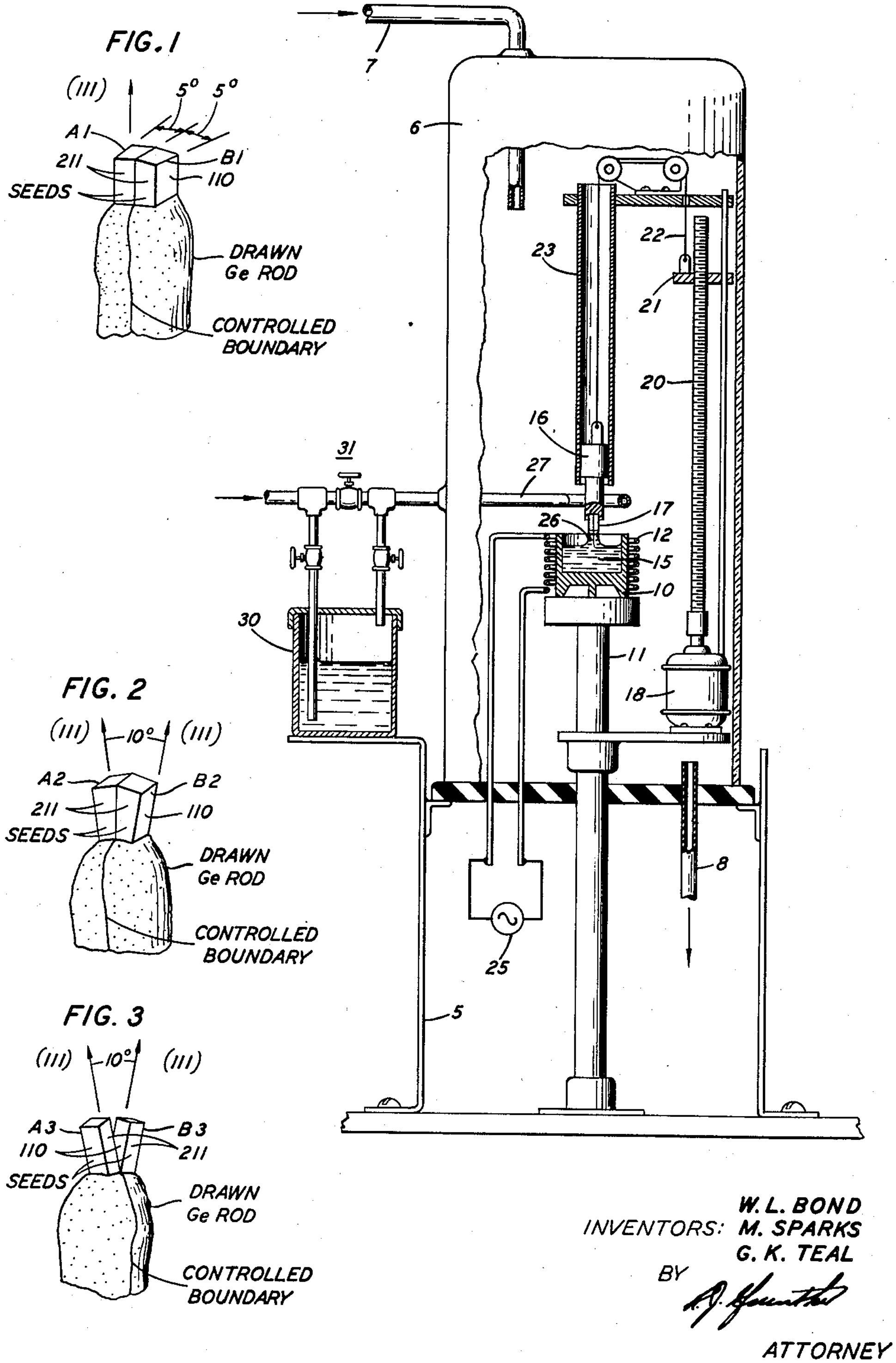
Figs. 1, 2 and 3 show seeds of juxtaposed crystals of like conductivity mismatched with relation to the three mutually rectangular axes, respectively.
Fig. 4 shows, mainly in diametral vertical section, an apparatus suitable for drawing rods of semiconductor material from a melt of the like material.

Referring now to Fig. 1, two seed crystals $A_1$ and $B_1$ of N-type germanium are schematically shown juxtaposed (by a clamp not shown) after being separately machined to provide at the common surface an approximately ten-degree crystalline mismatch about an axis, in this case vertical and normal to the (111) plane. Part of a drawn rod of germanium is shown attached to the seeds, constituting a compound crystal having a boundary continuous with the surface of contact of the seed crystals. The machining is done in accordance with X-ray analyses of crystalline structure of the seeds.

Fig. 2 is a like schematic showing wherein the seed crystals $A_2$, $B_2$ are mismatched ten degrees about an axis normal to the (211) plane, while Fig. 3 similarly represents two seed crystals $A_3$, $B_3$ equally mismatched about an axis normal to the (110) plane, and in each a part of the compound crystal drawn by the seeds. In each of Figs. 1, 2 and 3, the arrows indicate the normals to the (111) planes of the two seeds, these normals being similarly directed in Fig. 1.

As before stated, the crystal boundary in each case is a sheet of P-type conductivity intervening between two N-type regions, lengthwise of the drawn germanium rod. The component crystals of the rod are physically continuous across the boundary.

Fig. 4 shows in vertical section the essential features of the apparatus employed to draw the rods shown, in part, in Figs. 1, 2 and 3.

Two seeds 17 of N-type germanium, each of which may have been part of a single rod crystal drawn as is to be the compound crystal, and understood to have been machined for mismatched juxtaposition as earlier described, are clamped together, with their (111) planes approximately aligned.

Stand 5 supports bell jar 6 through which hydrogen is passed, entering at inlet 7 and emerging at outlet 8. Graphite crucible 10 surmounting post 11, contains a mass 15 of high purity N-type germanium prepared, say, by the method disclosed and claimed in Patent 2,576,267, granted November 27, 1951, to J. H. Scaff and H. C. Theuerer, "Preparation of Germanium Rectifier Material." Seeds 17 are suitably fastened, with their surface of contact vertical, in the lower end of weight 16, which moves upward when motor 18 is started. Motor 18 turns threaded shaft 20 operating unit 21 and so wire 22 to raise weight 16 along the axis of tube 23. After the apparatus has been flushed of air, hydrogen is caused to flow through jar 6 at the rate of about 100 cubic feet per hour. The germanium mass 15 is melted by a high frequency current from source 25, through water-cooled coil 12 which heats by induction crucible 10. The molten germanium is maintained at a temperature slightly above its melting point.

Motor 18 is operated to lower seeds 17 into the molten mass 15, to a depth of a millimeter or so; the seeds are left immersed in the germanium melt long enough for the establishment of temperature equilibrium. In this period a portion of the seeds is melted to relieve strains, and the molten mass is lifted by surface tension to embrace and adhere to the solid portions of the seeds. Motor 18 is then operated to raise seeds 17 and the molten material adherent thereto at a rate substantially equal to the rate of solidification of the adherent germanium, which consequently takes the form of a column 26 in which boundary 36 appears as a prolongation of the surface of contact of the seed crystals.

As column 26 is lifted, cooling jets of hydrogen from a tank not shown are played on its surface through orifices in ring 27. The hydrogen may be taken directly from the tank or through water in jar 30, according as valves 31 are manipulated. Size of column 26 may be varied by varying the rate of flow of the cooling hydrogen.

Figure 5:
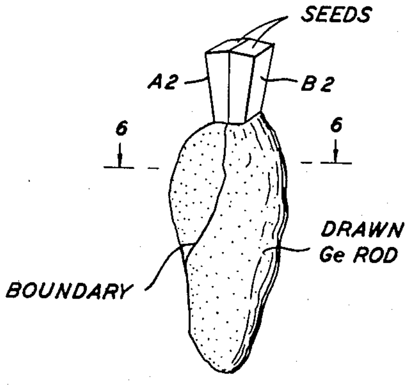
Fig. 5 illustrates a rod drawn by the apparatus of Fig. 4 using the duplex seed of Fig. 2.

Fig. 5 illustrates the appearance of a germanium rod with boundary roughly lengthwise of the rod drawn by seeds $A_2$, $B_2$ of Fig. 2. In this illustration, the boundary has grown out at one side of the rod due to mechanical or thermal instability incurred in the drawing operation.

Figure 6:
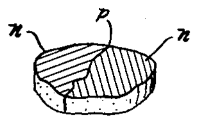
Fig. 6 illustrates a section cut from the rod of Fig. 5 at the plane 6—6 thereof.

Fig. 6 illustrates a slice of the rod of Fig. 5 cut therefrom at the level 6—6. It is found on examination to constitute an NPN junction, the crystal boundary being the locus of a sheet of P-type germanium while the outer portions of the disc are N-type slices of the two crystals, descendants of crystals $A_2$ and $B_2$ but physically continuous with each other. The grain boundary is an active NPN junction and slices such as that of Fig. 6 are useful as transistors with low base resistance.

It is found that for best results in the direction of growth, that is, vertical in the apparatus of Fig. 4, the crystal plane of juxtaposition of the two seeds is preferably the (110) plane, that being the simplest plane parallel to the "vector (111)"; by the last expression is meant the normal to the (111) plane. Such is the choice of Fig. 1, exactly, and approximately in Figs. 2 and 3.

A slice such as that of Fig. 6 is etched, washed and provided with contacts soldered or electroplated on each side of the boundary. An NPN junction comprises a pair of opposed rectifying barriers, so that a current-voltage curve for such a slice should have approximately the same form whichever the direction of current flow across the boundary.

Figure 7:
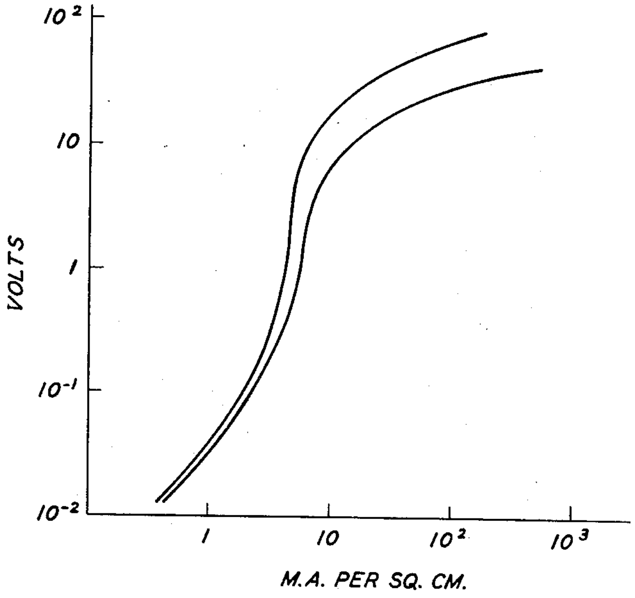
Fig. 7 is a graph of the current-voltage relationship across the grain boundary identified in Fig. 6.

That such is the case is shown by the curves of Fig. 7, obtained with the slice of Fig. 6. The curves are almost coincident. All the electrical properties are extremely sensitive to surface conditions and may be changed advantageously by etching.

What is claimed is:

1. A rod of semiconductor material selected from the group consisting of germanium and silicon consisting of two longitudinal single crystals of N-type electrical conductivity having crystalline orientations differing by about ten degrees, said crystals being physically continuous across an intervening region of P-type electrical conductivity, the (111) planes of the crystals being transverse to the rod.

2. A bicrystalline rod of germanium consisting of two longitudinal single crystal regions of N-type germanium with an intervening region of P-type germanium, the N-type regions being physically continuous across the intervening region and extending lengthwise normal to the (111) plane, said two single crystal regions having crystalline orientations differing by about ten degrees.

3. A rod of semiconductor material selected from the group consisting of germanium and silicon consisting of a pair of longitudinally adjoined single crystals of the material with an angle of mismatch of the order of ten degrees between adjacent crystal lattices.

4. A rod as in claim 3 in which the material is germanium.

5. A rod as in claim 3 in which the material is silicon.

6. A rod as in claim 3 in which the crystalline plane of greatest atomic density of both of single crystals extends transversely of the rod.

References Cited in the file of this patent

UNITED STATES PATENTS

| Number | Name | Date |
|---|---|---|
| 2,402,661 | Ohl | June 25, 1946 |

OTHER REFERENCES

Proceedings, Royal Society of London, Series A, vol. 162, pages 120–122, 1937.